United States Patent
Gronau et al.

(10) Patent No.: US 9,490,101 B2
(45) Date of Patent: Nov. 8, 2016

(54) SYSTEM AND METHOD FOR SCANNING AN OBJECT

(71) Applicant: APPLIED MATERIALS ISRAEL LTD., Rehovot (IL)

(72) Inventors: Yuval Gronau, Ramat Hasharon (IL); Ishai Schwarzband, Or-Yehuda (IL); Benzion Sender, Modiin-Macabim-Reut (IL); Dror Shemesh, Hod Hasharon (IL); Ran Schleyen, Gdera (IL); Ofir Greenberg, Haniel (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 14/658,993

(22) Filed: Mar. 16, 2015

(65) Prior Publication Data

US 2016/0276127 A1    Sep. 22, 2016

(51) Int. Cl.
*G01N 23/00* (2006.01)
*H01J 37/22* (2006.01)
*H01J 37/28* (2006.01)

(52) U.S. Cl.
CPC .............. *H01J 37/222* (2013.01); *H01J 37/28* (2013.01); *H01J 2237/221* (2013.01)

(58) Field of Classification Search
CPC ...... H01J 37/00; H01J 37/222; H01J 37/226; H01J 37/24; H01J 37/244; H01J 37/26; H01J 37/261; H01J 37/268; H01J 37/28; H01J 37/285; H01J 37/2955; H01J 37/02; H01J 37/04; H01J 37/10; H01J 37/12; H01J 37/14; H01J 37/141; H01J 37/147; H01J 37/1472; H01J 37/1474; H01J 37/1475; H01J 37/1477

USPC ......................................... 250/306, 307, 311
See application file for complete search history.

(56) References Cited

U.S. PATENT DOCUMENTS

| | | | |
|---|---|---|---|
| 6,710,342 B1 | 3/2004 | Jau et al. | |
| 7,756,658 B2 | 7/2010 | Kulkarni et al. | |
| 8,063,363 B2 | 11/2011 | Yeh et al. | |
| 8,207,499 B2 | 6/2012 | Shoham et al. | |
| 8,299,431 B2 | 10/2012 | Zhao et al. | |
| 8,497,475 B2 | 7/2013 | Yeh et al. | |
| 2001/0002697 A1* | 6/2001 | Hiroi | H01J 37/28 250/310 |
| 2010/0072365 A1* | 3/2010 | Shoham | G01N 23/2208 250/307 |
| 2011/0170091 A1 | 7/2011 | Chang et al. | |
| 2012/0307038 A1* | 12/2012 | Hoshino | H01J 37/244 348/80 |
| 2015/0002651 A1* | 1/2015 | Shimizu | H01J 37/222 348/80 |

* cited by examiner

*Primary Examiner* — Jason McCormack
(74) *Attorney, Agent, or Firm* — Kilpatrick Townsend & Stockton LLP

(57) ABSTRACT

A system for scanning an object, the system may include (a) charged particles optics that is configured to: scan, with a charged particle beam and at a first scan rate, a first region of interest (ROI) of an area of the object; detect first particles that were generated as a result of the scanning of the first ROI; scan, with the charged particle beam and at a second scan rate, a second ROI of the area of the object; wherein the second scan rate is lower than the first scan rate; wherein first ROI differs from the second ROI by at least one parameter; detect second particles that were generated as a result of the scanning of the second ROA; and (b) a processor that is configured to generate at least one image of the area in response to the first and second particles.

11 Claims, 9 Drawing Sheets

Initially scanning an area of an object at an initial scan rate; detecting initial particles that were generated as a result of the initial scanning of the area; generating at least one initial image of the area in response to the initial particles; processing the at least one initial image to detect the a first region of interest (ROI) and a second ROI; wherein first ROI differs from the second ROI by at least one parameter. 810

Performing at least one additional scanning the second ROI so that the second ROI is scanned more times than the first ROI; detecting second particles that were generated as a result of at least one additional scanning of the second ROI; and generating an image of the area in response to the initial particles and to the second particles. 820

*FIG. 8*

SYSTEM AND METHOD FOR SCANNING AN OBJECT

BACKGROUND OF THE INVENTION

Objects such as wafers may be manufactured by highly complicated manufacturing processes. These manufacturing processes should be monitored in order to ensure the quality of the wafers.

The monitoring process may include a first phase of an optical, ultraviolet, deep ultraviolet, extreme ultraviolet of electron beam inspection to detect potential defects and a second phase of defect review.

Defect review may be usually executed by a scanning electron microscope (SEM) that exhibits a very high resolution (nanometric order). A SEM usually acquires multiple images of the same area (multiple consecutive scans of the area) and then averages these multiple images to provide an output image of the area. The output image can be displayed to an operator. The operator may be expected to evaluate the area in view of the output image.

A high aspect ratio hole such as a deep trench or a deep void, may have an aspect ratio that exceeds 20. The high aspect ratio and the small width of the high aspect ratio hole cause the bottom of the high aspect ratio hole to exhibit a very low electron yield.

The electron yield of the bottom of the high aspect ratio hole may be the ratio between (a) a number of electrons that originate from the bottom of the high aspect ratio hole and may be detected by the SEM as a result of an irradiation of the high aspect ratio hole and (b) the number of electrons that irradiate the high aspect ratio hole.

Other non-limiting examples of low electron yield structures include vertical NAND memory structures and trenches.

Obtaining image of a desired quality may require the SEM to scan an entire area (that includes both high and low electron yield regions) at a very low scan rate.

There may be a growing need to improve the review of areas that include high and low electron yield regions.

BRIEF SUMMARY OF THE INVENTION

According to an embodiment of the invention there may be provided a system for scanning an object. The system may include charged particles optics and a processor. The charged particle optics may be configured to: scan, with a charged particle beam and at a first scan rate, a first region of interest (ROI) of an area of the object; detect first particles that were generated as a result of the scanning of the first ROI; scan, with the charged particle beam and at a second scan rate, a second ROI of the area of the object, where the second scan rate may be lower than the first scan rate and first ROI differs from the second ROI by at least one parameter; and detect second particles that were generated as a result of the scanning of the second ROA. The processor may be configured to generate at least one image of the area in response to the first and second particles.

The parameter may be electron yield; and wherein an electron yield of the second ROI may be lower than an electron yield of the first ROI.

The parameter may be an expected electron yield; and wherein an expected electron yield of the second ROI may be lower than an electron yield of the first ROI.

The parameter may be a signal to noise ratio; and wherein a signal to noise ratio of the second ROI may be lower than a signal to noise ratio of the first ROI.

The parameter may be a distance from a center of the area; wherein the second ROI may be closer to a center of the area than the first ROI.

The parameter may be a priority; and wherein a priority of the second ROI may be higher than a priority of the first ROI.

The charged particles optics may be configured to perform an initial scanning of the area of the object at an initial scan rate; detect initial particles that were generated as a result of the initial scanning of the area; generate at least one initial image of the area in response to the initial particles; and wherein the processor may be configured to process the at least one initial image to detect the first and second ROI.

The processor may be configured to define a first segment and a second segment that belong to the area; wherein the first segment may include the first ROI and the second segment may include the second ROI; wherein a scanning of the first ROI at the first scan rate may be included in a scanning of the first segment; wherein a scanning of the second ROI at the second scan rate may be included in a scanning of the second segment.

The initial scan rate may be higher than the second scan rate.

According to an embodiment of the invention there may be provided a method for imaging an object, the method may include scanning, with a charged particle beam and at a first scan rate, a first region of interest (ROI) of an area of the object; detecting first particles that were generated as a result of the scanning of the first ROI; scanning with the charged particle beam and at a second scan rate, a second ROI of the area of the object; wherein the second scan rate may be lower than the first scan rate; wherein first ROI differs from the second ROI by at least one parameter; detecting second particles that were generated as a result of the scanning of the second ROA; and generating at least one image of the area in response to the first and second particles.

The parameter may be an electron yield; and wherein an electron yield of the second ROI may be lower than an electron yield of the first ROI.

The parameter may be an expected electron yield; and wherein an expected electron yield of the second ROI may be lower than an electron yield of the first ROI.

The parameter may be a signal to noise ratio; and wherein a signal to noise ratio of the second ROI may be lower than a signal to noise ratio of the first ROI.

The parameter may be a distance from a center of the area; wherein the second ROI may be closer to a center of the area than the first ROI.

The parameter may be a priority; and wherein a priority of the second ROI may be higher than a priority of the first ROI.

The method may include performing an initial scanning of the area of the object at an initial scan rate; detecting initial particles that were generated as a result of the initial scanning of the area; generating at least one initial image of the area in response to the initial particles; and processing the at least one initial image to detect the first and second ROI.

The method may include defining a first segment and a second segment that belong to the area; wherein the first segment may include the first ROI and the second segment may include the second ROI; wherein the scanning of the first ROI at the first scan rate may be included in a scanning of the first segment; wherein the scanning of the second ROI at the second scan rate may be included in a scanning of the second segment.

The initial scan rate may be higher than the second scan rate.

According to an embodiment of the invention there may be provided a method for imaging an object, the method may include: initially scanning an area of an object at an initial scan rate; detecting initial particles that were generated as a result of the initial scanning of the area; generating at least one initial image of the area in response to the initial particles; processing the at least one initial image to detect the a first region of interest (ROI) and a second ROI; wherein first ROI differs from the second ROI by at least one parameter; performing at least one additional scanning the second ROI so that the second ROI may be scanned more times than the first ROI; detecting second particles that were generated as a result of at least one additional scanning of the second ROI; and generating an image of the area in response to the initial particles and to the second particles.

The at least one additional scanning of the second ROI does not include scanning the first ROI.

The method may include defining a second segment; wherein the second segment may include the second ROI; wherein the at least one additional scanning of the second ROI may be included in the scanning of the second segment.

The parameter may be an electron yield; and wherein an electron yield of the second ROI may be lower than an electron yield of the first ROI.

The parameter may be an expected electron yield; and wherein an expected electron yield of the second ROI may be lower than an electron yield of the first ROI.

The parameter may be a signal to noise ratio; and wherein a signal to noise ratio of the second ROI may be lower than a signal to noise ratio of the first ROI.

According to an embodiment of the invention there may be provided a method that may include scanning an area that may include a first region of interest (ROI) and a second ROI region of interest; wherein each unit area of the first ROI may be illuminated with less electrons than each unit area of the second ROI; detecting particles that were generated as a result of the scanning of the area; and generating an image of the area in response to the particles.

The scanning of the area may include performing a first number of scan iterations of the first ROI and a second number of scan iterations of the second ROI; wherein the first number may be smaller than the second number.

The scanning of the area may include performing a first number of scan iterations of the first ROI and a second number of scan iterations of the second ROI; wherein at least one scan iteration of the second ROI may be performed at a second scan rate; wherein at least one scan iteration of the first ROI may be performed at a first scan rate; wherein the second scan rate may be lower than the first scan rate.

At least a part of the first number of scan iterations of the first ROI may be including in a scan of the entire area.

The scanning of the area may include performing at least one scan iteration of the first ROI using a charged particle beam of a first current and performing one or more scan iterations of the second ROI using a charged particle beam of a second current, wherein the first current differs from the second current.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 8 illustrates a method according to an embodiment of the invention;

Figure 1:
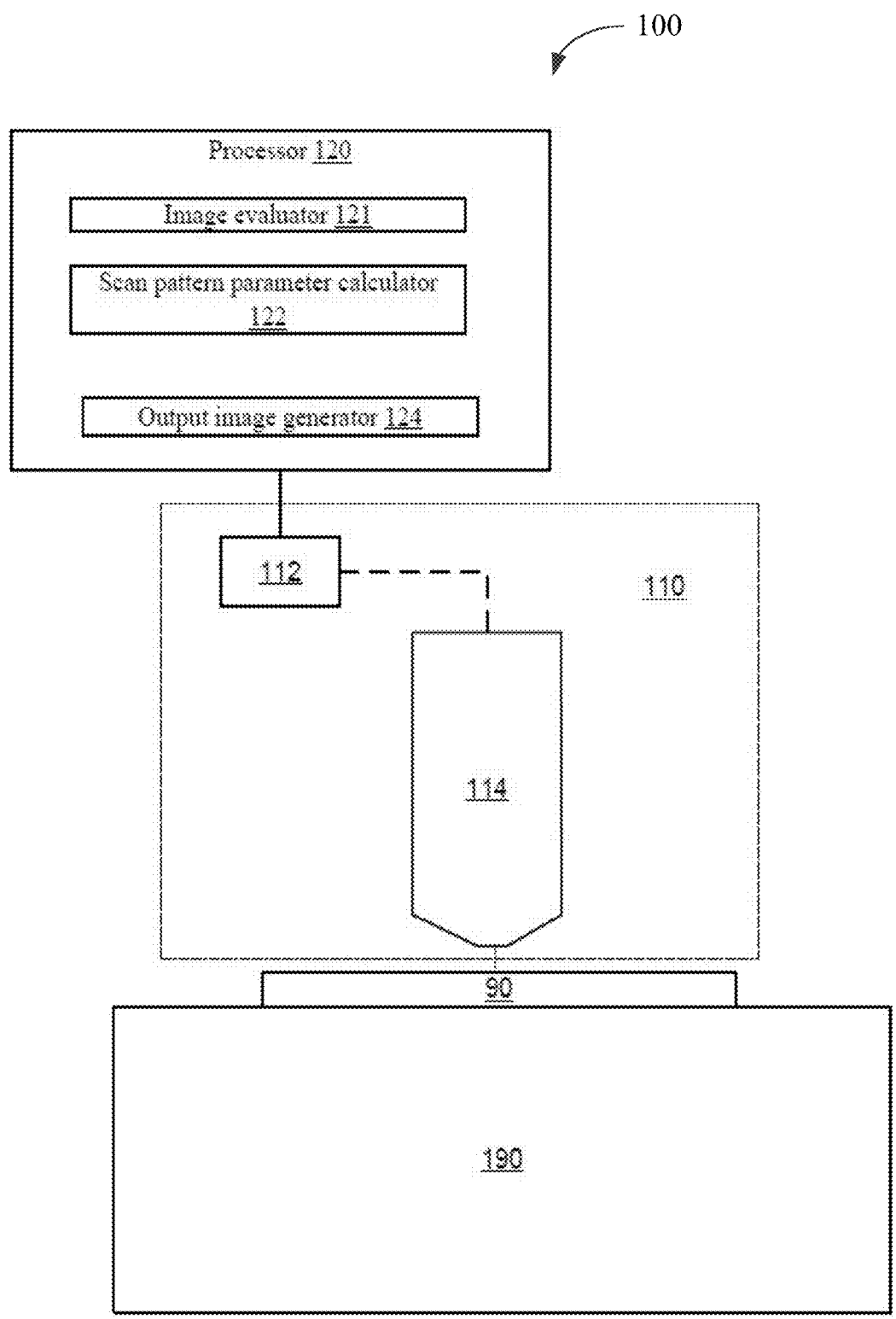
FIG. 1 illustrates a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

FIG. 1 illustrates system 100 according to an embodiment of the invention.

FIG. 1 illustrates system 100 as being a charged particles imager such as but not limited to a scanning electron microscope (SEM) or an electron beam inspection (EBI) system.

System 100 includes an image obtaining module 110, processor 120 and a mechanical stage 190 for supporting and moving an object 90. The object may 90 be a wafer, a die or any other object.

Image obtaining module 110 may include a controller 112 and charged particles optics 111. The charged particles optics 111 is arranged to illuminate the object 90, one area after the other, wherein each area is expected to include one or more suspected defect that should be reviewed. The image obtaining module 110 may scan areas of the object 90 by using an adaptive scan pattern.

An area of the object may correspond to a field of view of the charged particle optics 111. For example—a field of view of the charged particle optics 111 may cover a single area of the object. Alternatively—the field of view may include multiple areas and/or less than an area.

An adaptive scan pattern is a scan pattern that may scan regions of interest of different parameters (priority, electron yield, signal to noise ratio (SNR)) at a different manner.

A priority of a region of interest (ROI) can be provided by a user of the system, by a client, may be based upon previous review iterations, and the like. For example—a higher priority may be assigned to a ROI that is more critical to the functionality of the object, to an ROI that includes suspected defects of interest, to an ROI that include certain structural elements, and the like.

An electron yield of an ROI is a ratio between (a) a number of electrons that are detected by image obtaining module 110 as a result of an illumination of the ROI, and (b) a number of electrons that illuminated the ROI. A low electron yield ROI may have an electron yield ratio that is lower than a predefined threshold such as but not limited 0.1, 0.01 or even a lower predefined threshold.

For example, at an integration time of 0.1 μsecond and at a current of 100 pA an area with a yield of 0.01 would yield less than one electron per pixel per frame.

For example, it is assumed that an area of the object includes a first ROI and a second ROI.

The second ROI may be of a higher priority than the first ROI.

The second ROI may be of a lower electron yield than the first ROI.

The second ROI may have an image that has a lower SNR than the SNR of an image of the first ROI.

An adaptive scan pattern may involve scanning the second ROI so that the second ROI is illuminated with more electrons per unit area than the first ROI.

The shape and/or orientation of a ROI may not match a desired scan pattern. For example—the ROI may be elliptical or fuzzy while the scan pattern may fit rectangular regions.

In this case the system may define a segment that includes the ROI and is of a desired shape and scan the second segment.

The segment may have a rectangular shape or any other shape and be of any orientation. The ROI may be of any shape and orientation.

The controller 112 may be configured to control the charged particles optics 111 so that the charged particle optics 111 scans an area that includes a first ROI and a second ROI. Each unit area of the first ROI is illuminated with less electrons than each unit area of the second ROI.

The illumination of each unit area of the first ROI by less electrons then each area unit of the second ROI may be achieved in various manners, such as:
  a. The second ROI may be scanned more times than the first ROI.
  b. The second ROI may be scanned at a lower scan rate than the first ROI.
  c. The second ROI may be scanned by a stronger current than the first ROI.

It is noted that any combination of the mentioned above manners may be applied.

It is further noted that changing the current may be more time consuming than either one of manner (a) and (b).

According to an embodiment of the invention the first and second ROIs may be determined before images of the area are acquired. For example—the first and second ROIs may be inferred from a computer aided design (CAD) information regarding the area, may be predefined as ROI of priority, and the like.

According to an embodiment of the invention the first and second ROI may correspond to their locations within the area.

In many cases the area (to be scanned by the system) is defined in response to (a) an expected location of a suspected defect and (b) location inaccuracies of system 100 and of the inspection system that detected the suspected defect.

Typically, the suspected defect is located within a second ROI and is positioned at the center of the area. Additional margins are defined around the center of the area to compensate for the location inaccuracies.

Accordingly—there is a higher probability to find the suspected defect in the center of the area than in the periphery of the area. Therefore—the adaptive scan pattern may scan the center of the area with more electrons per unit area than the periphery of the area. This adaptive scan pattern can be applied even without knowing the exact location of the suspected defect.

It is further noted that the expected location of the second ROI may me also responsive to location errors of the system 100. The second ROI may be defined in response to the location of the center of the area and in response to previous location errors of the system. If, for example, the previous locations errors were of a certain magnitude and at a certain direction then the location of the second ROI will be diverted from the center to the opposite direction and by the certain magnitude.

According to an embodiment of the invention the first and second ROIs are not known in advance and may be detected during the scanning of the area. One or more images of the area may be processed to find low yield electron regions of the area and/or low SNR regions of the area.

The system 100 may perform one or more initial scans of the area and obtain one or more initial images of the area. Processor 120 may process the one or more initial images and locate the first and second ROI areas.

Referring back to FIG. 1—processor 120 is illustrated as including an image evaluator 121, a scan pattern parameter calculator 122 and an output image generator 124.

The image evaluator 121 is configured to process one or more initial images of the area and to find the first and/or second ROIs based upon the SNR and/or electron yield of the different regions of the area. The image evaluator 121 may, for example, analyze an initial image (for example image 200 of FIG. 2) and find (a) the first till third dark regions 201, 202 and 203, and (b) the high electron yield region 204.

The scan pattern parameter calculator 122 may be configured to define one or more parameters of the adaptive scan pattern. The one or more parameters may include a number of scans of each ROI, an intensity of the electron beam used to illuminate each ROI, a scan rate of each one of the ROIs and/or a shape and size of segments of the area to be scanned.

The segments of the area include one or more second ROIs but have a shape and/or orientation that may better fit to the manner in which system 100 scans an object.

Figure 2:
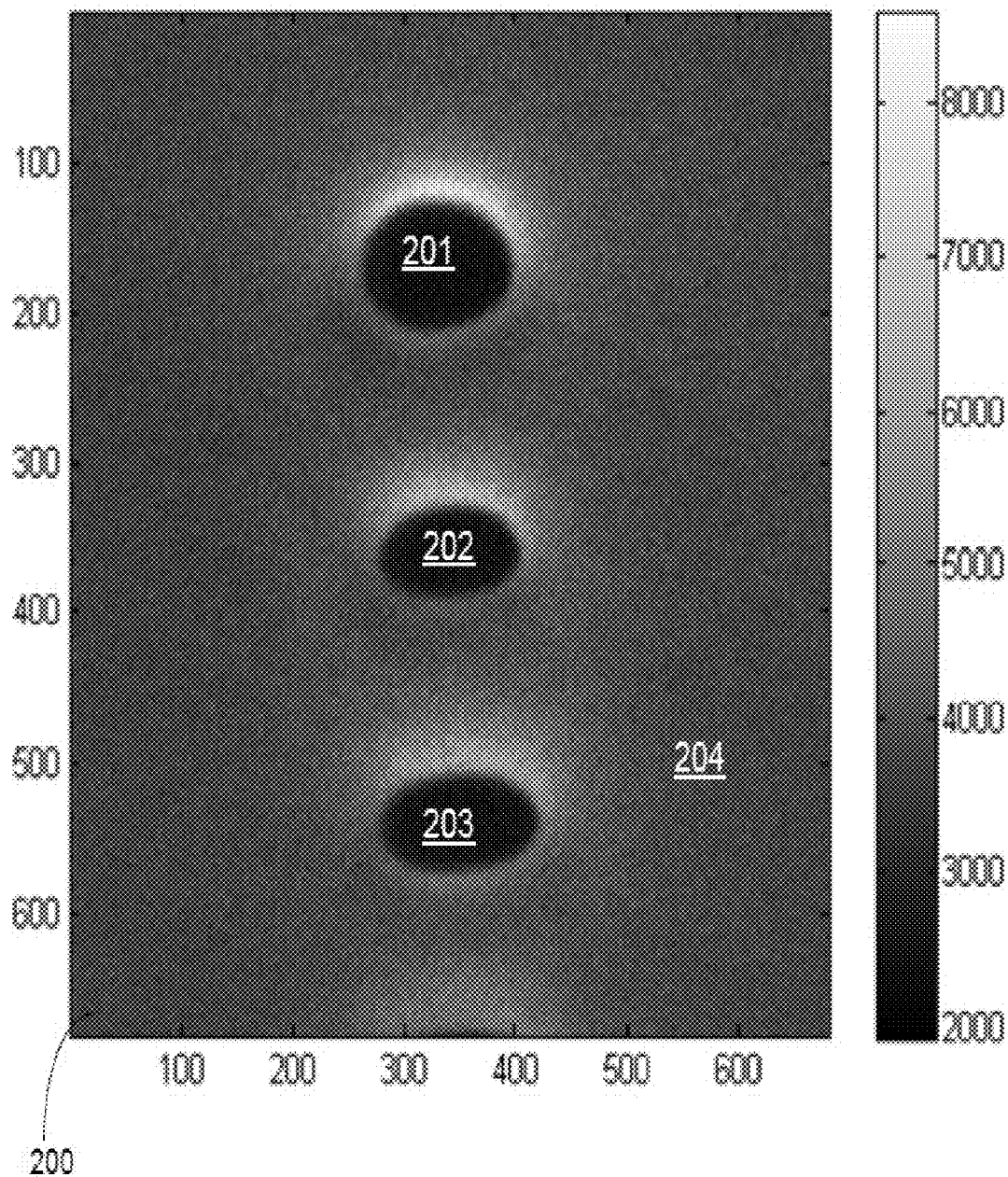
FIG. 2 illustrates an image of an area according to an embodiment of the invention.

FIG. 2 illustrates an image 200 of an area of the object. The image 200 includes:
a. First dark region 201, second dark region 202 and third dark region 203 of low electron yield.
b. High electron yield region 204 that surrounds First dark region 201, second dark region 202 and third dark region 203.

The high electron yield region 204 may be defined as a first ROI while the first dark region 201, the second dark region 202 and the third dark region 203 may be defined as second ROIs that require more illumination.

Figure 3A:
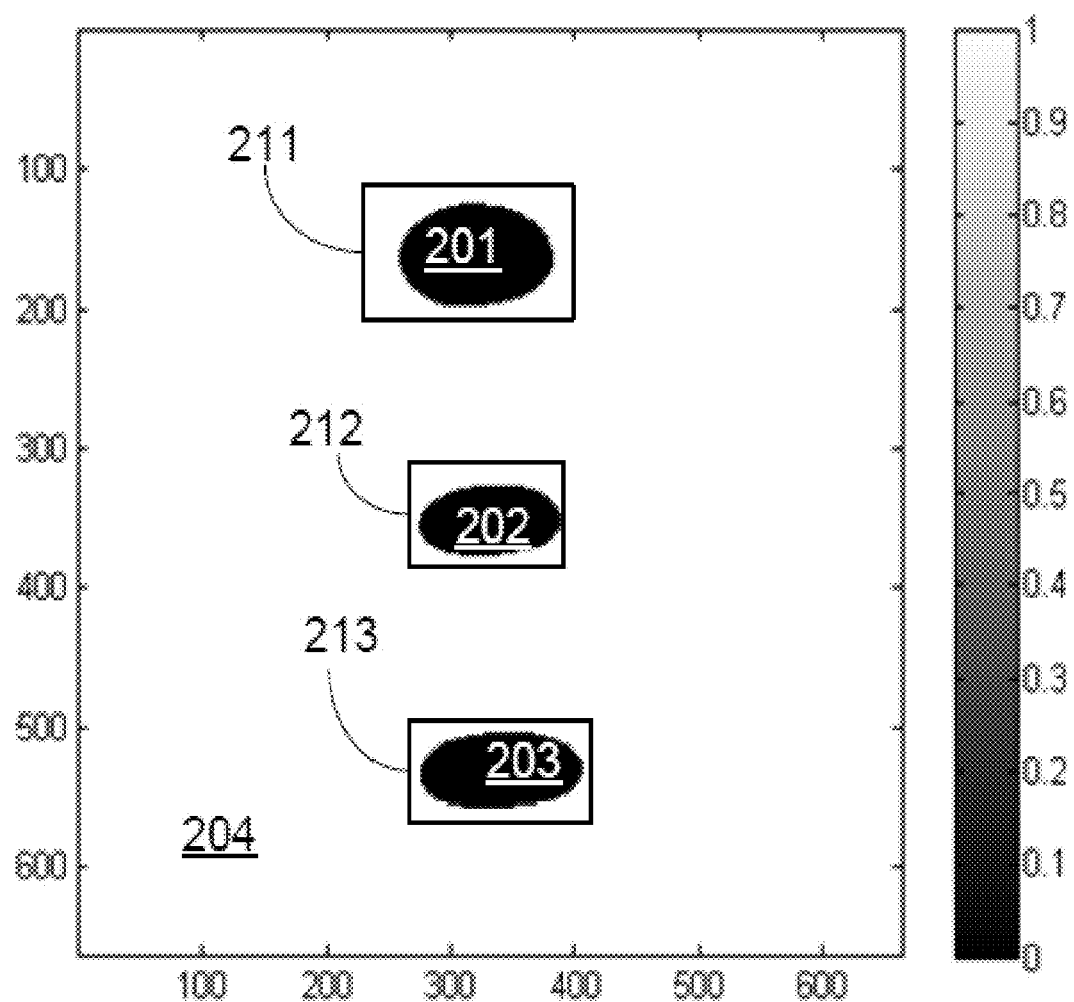
FIG. 3A illustrates an image of the area shown in FIG. 2, three dark regions and three segments, each of which surrounds one of the dark regions shown in FIG. 2, according to an embodiment of the invention.
Figure 3B:
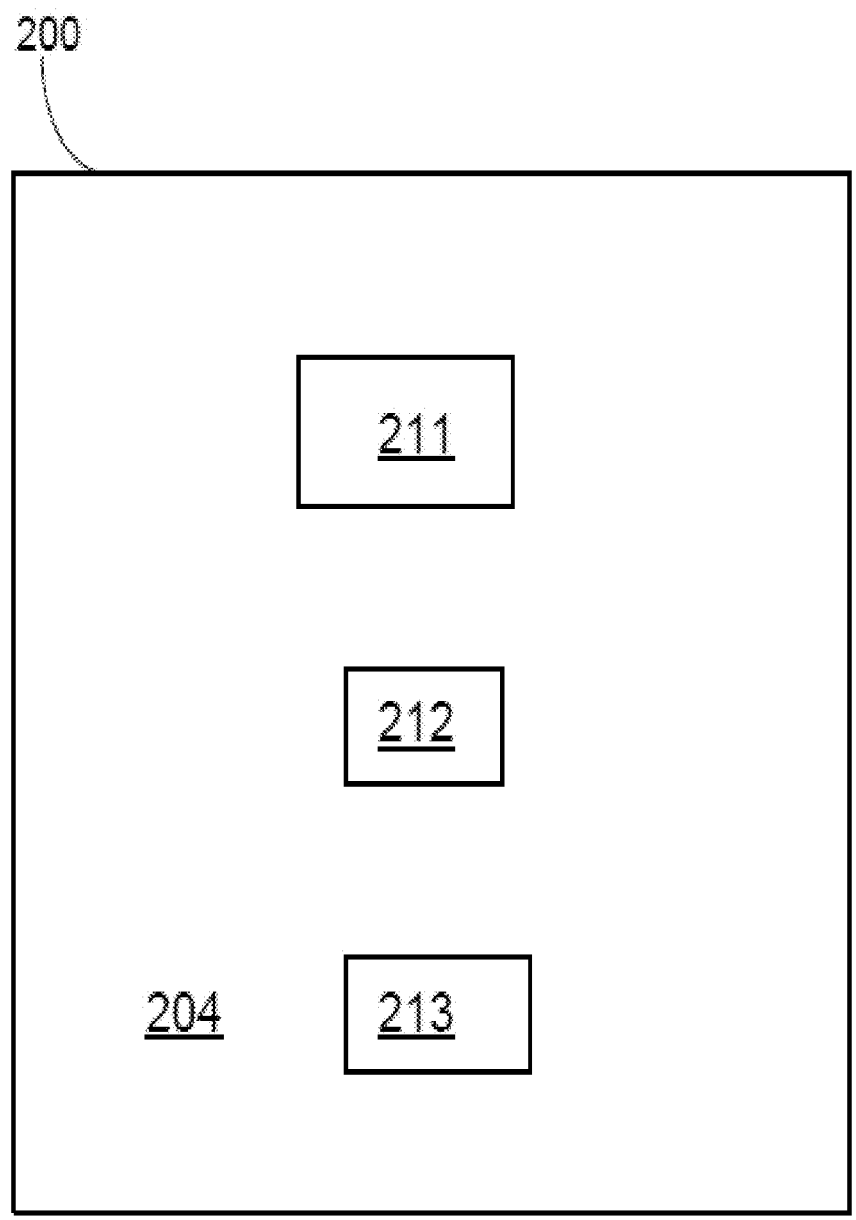
FIG. 3B illustrates an image of the area shown in FIG. 2 and the three segments shown in FIG. 3A according to an embodiment of the invention.

FIG. 3A illustrates the first dark region 201, the second dark region 202 and the third dark region 203 as well as first segment 211, second segment 212 and third segment 213, according to an embodiment of the invention. FIG. 3B illustrates the first segment 211, second segment 212 and third segment 213, according to an embodiment of the invention The first segment 211 has a rectangular shape and surrounds first dark area 201. The second segment 212 has a rectangular shape and surrounds second dark area 202. The third segment 213 has a rectangular shape and surrounds third dark area 203.

Figure 4:
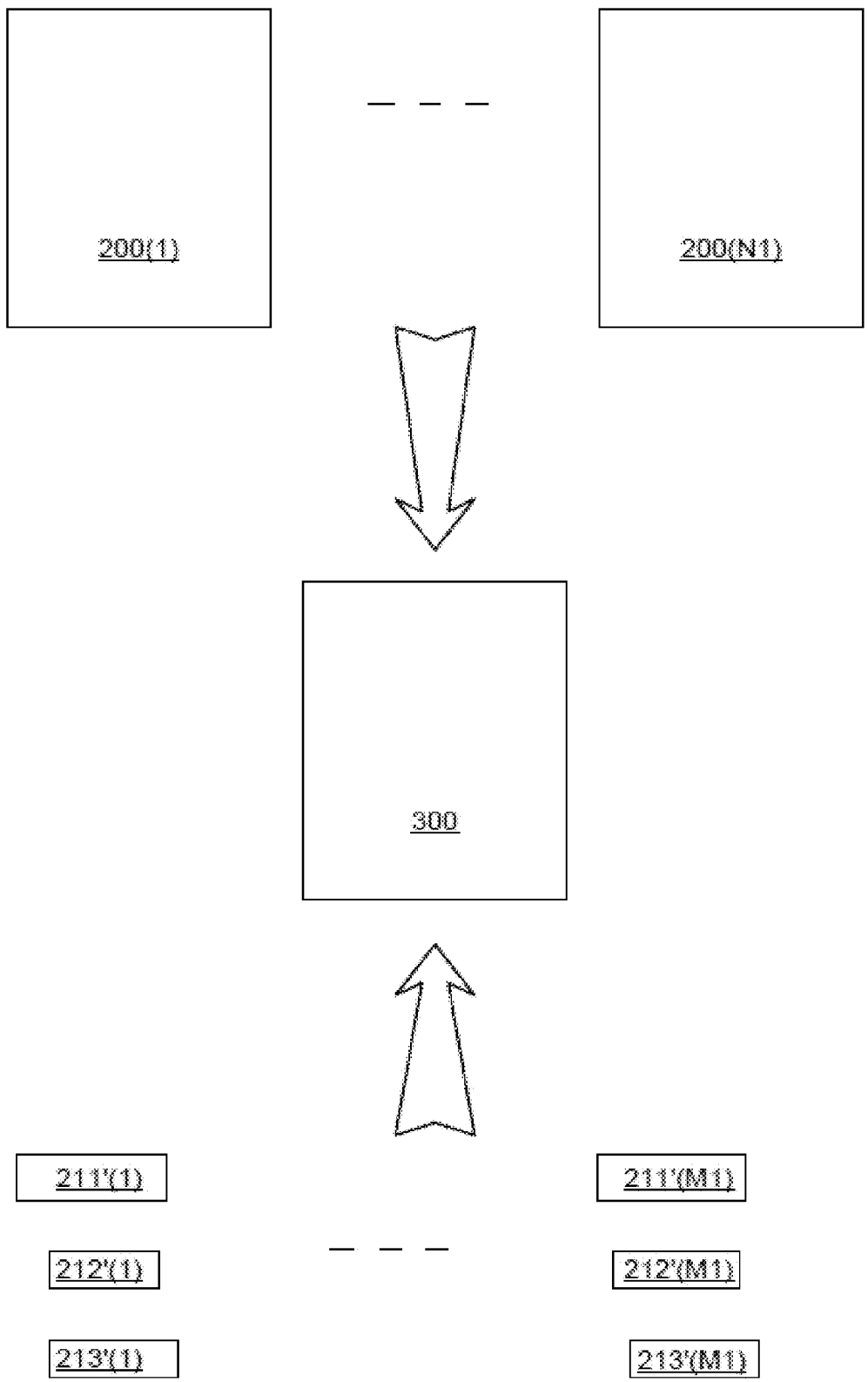
FIG. 4 illustrates multiple images according to an embodiment of the invention.

FIG. 4 illustrates images acquired during an adaptive scan pattern that includes:
a. Scanning the entire area a first number (N1) of times to provide images 200(1)-200(N1).
b. Scanning only the first segment 211, second segment 212 and third segment 213 for a plurality (M1) of additional times to provide images 211'(1)-211'(M1), 212'(1)-212'(M1) and 213'(1)-213'(M1).

It is noted that the while FIG. 4 illustrates that each one of the first segment 211, second segment 212 and third segment 213 is scanned M1 times, it is noted that one segment may be scanned more times than another segment.

Overall—the first dark region 201, second dark region 202 and third dark region 203 are scanned a second number (N2) of times, wherein N2=N1+M1.

Images 200(1)-200(N1), 211'(1)-211'(M1), 212'(1)-212'(M1) and 213'(1)-213'(M1) are processed to provide output image 300 of the area.

Figure 5:
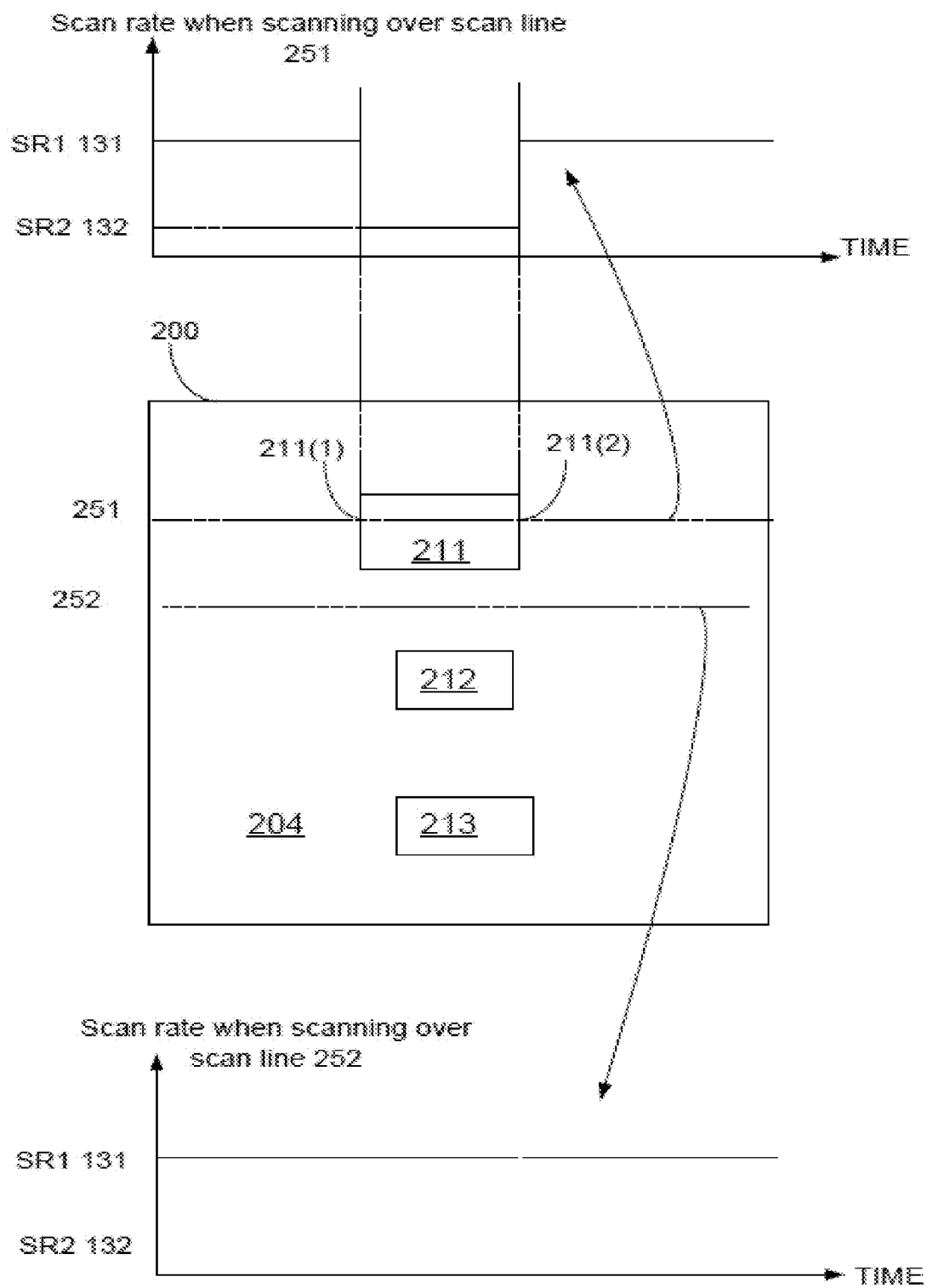
FIG. 5 illustrates an adaptive scan pattern and multiple scan rates applied during the appliance of the adaptive scan pattern according to an embodiment of the invention.

FIG. 5 illustrates an image 200 of an area that is acquired during an adaptive scan pattern that includes:
a. Scanning high electron yield region 204 at a first scan rate SR1 131.
b. Scanning each one of the first till third segments 211, 213 and 213 at a second scan rate SR2 131 that is lower than SR1 131.

A first scan line 251 that virtually scans high electron yield region 204 and first segment 211. The scanning, along the first scan line, stars by scanning a left part of the high electron yield region 204 at a first scan rate SR1 131 before reaching first segment 211, scanning the first segment 211 at a second scan rate SR2 132, and scanning a right part of the high electron yield region at the firsts can rate SR1 131. It is noted that the change of the scan rate can be made in various manners—not just in the stepped manner illustrated in FIG. 5.

A second scan line 252 that virtually scans only the high electron yield region 204 is scanned at the first scan rate SR1 131.

It is noted that different scans of different regions (or segments) may differ from each other by one or more attribute other than a scan rate. Non-limiting examples of such an attribute are intensity, focal point, spot size and/or shape, and the like.

Figure 6:
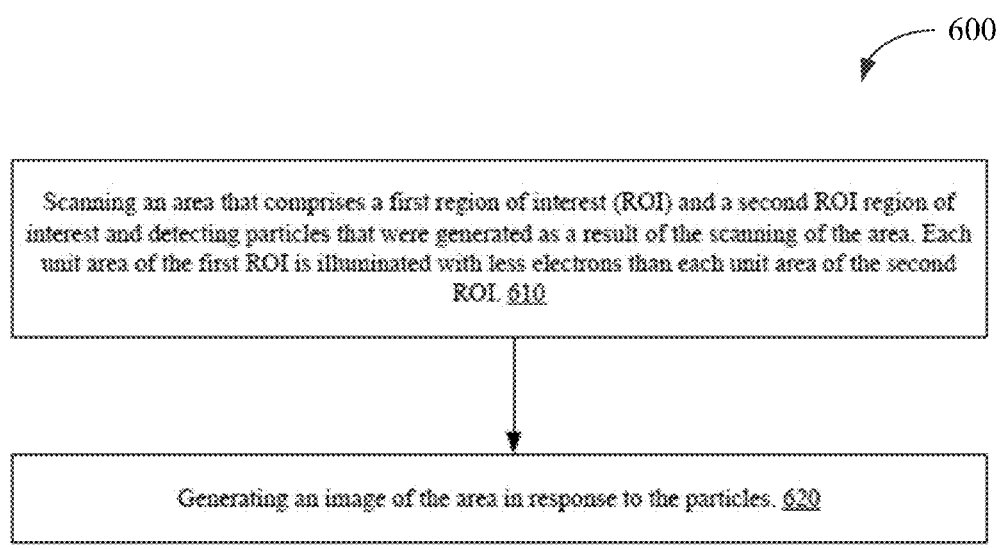
FIG. 6 illustrates a method according to an embodiment of the invention.

FIG. 6 illustrates method 600 according to an embodiment of the invention.

Method 600 may start by step 610 of scanning an area that includes a first region of interest (ROI) and a second ROI region of interest and detecting particles (such as but not limited to secondary electrons) that were generated as a result of the scanning of the area. Each unit area of the first ROI is illuminated with less electrons than each unit area of the second ROI.

Step 610 may include performing a first number of scan iterations of the first ROI and a second number of scan iterations of the second ROI. The first number is smaller than the second number.

Step 610 may include performing a first number of scan iterations of the first ROI and a second number of scan iterations of the second ROI. At least one scan iteration of the second ROI is performed at a second scan rate. The at least one scan iteration of the first ROI is performed at a first scan rate. The second scan rate is lower than the first scan rate. At least a part of the first number of scan iterations of the first ROI is including in a scan of the entire area.

Different scan iterations may differ from each other by one or more attribute other than a scan rate. Non-limiting examples of such an attribute are intensity, focal point, spot size and/or shape, and the like.

Step 610 may be followed by step 620 of generating an image of the area in response to the particles.

Figure 7:
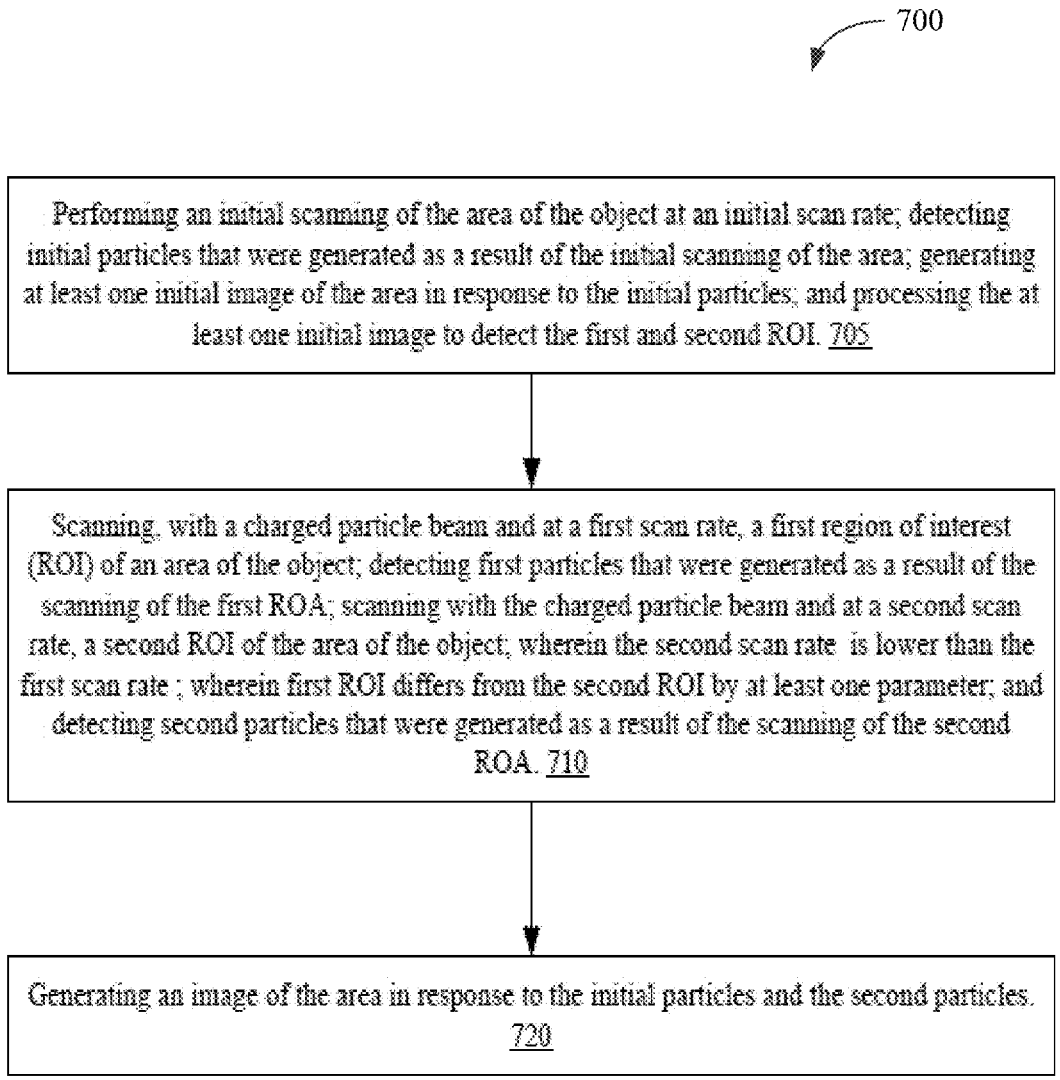
FIG. 7 illustrates a method according to an embodiment of the invention.

FIG. 7 illustrates method 700 according to an embodiment of the invention.

Method 700 may start by step 710 of:
a. Scanning, with a charged particle beam and at a first scan rate, a first region of interest (ROI) of an area of the object.
b. Detecting first particles that were generated as a result of the scanning of the first ROA.
c. Scanning with the charged particle beam and at a second scan rate, a second ROI of the area of the object. The second scan rate is lower than the first scan rate. The first ROI differs from the second ROI by at least one parameter.
d. Detecting second particles that were generated as a result of the scanning of the second ROA.

The at least one parameter may be an electron yield and the electron yield of the second ROI may be lower than an electron yield of the first ROI.

The at least one parameter may be an expected electron yield. An expected electron yield of a ROI is a ratio between the amount of electrons that impinge on the ROI and the amount of electrons that are expected (estimated) to be emitted from the ROI. The expected electron yield is determined before the ROI is scanned.

The at least one parameter may be a signal to noise ratio and the signal to noise ratio of the second ROI may be lower than a signal to noise ratio of the first ROI.

The at least one parameter may be a distance from a center of the area and the second ROI may be closer to a center of the area than the first ROI.

The at least one parameter may be a priority and a priority of the second ROI may be higher than a priority of the first ROI.

Step 710 may be preceded by step 705 of performing an initial scanning of the area of the object at an initial scan rate; detecting initial particles that were generated as a result of the initial scanning of the area; generating at least one initial image of the area in response to the initial particles; and processing the at least one initial image to detect the first and second ROI.

Step 705 may also include defining a first segment and a second segment that belong to the area; wherein the first segment comprises the first ROI and the second segment comprises the second ROI. The scanning of the first ROI at the first scan rate is included in a scanning of the first segment; wherein the scanning of the second ROI at the second scan rate is included in a scanning of the second segment.

The initial scan rate may be higher than the second scan rate.

Step 710 may be followed by step 720 of generating an image of the area in response to the particles.

FIG. 8 illustrates method 800 according to an embodiment of the invention.

Method 800 may start by step 810 of initially scanning an area of an object at an initial scan rate; detecting initial particles that were generated as a result of the initial scanning of the area; generating at least one initial image of the area in response to the initial particles; processing the at least one initial image to detect the a first region of interest (ROI) and a second ROI; wherein first ROI differs from the second ROI by at least one parameter.

Step 810 may be followed by step 820 of performing at least one additional scanning the second ROI so that the second ROI is scanned more times than the first ROI; detecting second particles that were generated as a result of at least one additional scanning of the second ROI; and generating an image of the area in response to the initial particles and to the second particles.

The at least one additional scanning of the second ROI may not include scanning the first ROI.

Step 810 may also include defining a second segment. The second segment may include the second ROI. In this case the at least one additional scanning of the second ROI is included in the scanning of the second segment.

Either one of steps 620, 720 and 820 may include merging information obtained from one or more ROI (or corresponding segment) and from one or more other regions of the area. This may include applying a smoothing operation or otherwise compensating for differences at borders between one region to another. This may include, for example, drift compensation, in case wherein the ROIs are scanned more times than the entire area and there may be an image drift between one image to the other. The merging may include, for example, blending of images of the entire area and of images of segments (or ROIs) by applying the following filter: alpha*Image 1+(1−alpha)*Image2 where alpha changes gradually along the border between two overlapping regions.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removable or remotely coupled to an information processing system. The computer readable media may include, for example and without limitation, any number of the following: magnetic storage media including disk and tape storage media; optical storage media such as compact disk media (e.g., CD ROM, CD R, etc.) and digital video disk storage media; nonvolatile memory storage media including semiconductor-based memory units such as flash memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for scanning an object, the system comprises:
charged particles optics configured to:
scan, with a charged particle beam, a first region of interest (ROI) of an area of the object at a first scan rate;
detect first particles that were generated as a result of the scanning of the first ROI;
scan, with the charged particle beam, a second ROI of the area of the object at a second scan rate lower than the first scan rate, wherein the first ROI differs from the second ROI by at least one parameter, the at least one parameter being either an electron yield, an expected electron yield or a signal to noise ratio; and
detect second particles that were generated as a result of the scanning of the second ROI; and
a processor that is configured to generate at least one image of the area in response to the first and second paricles;

wherein: (i) when the at least one parameter is an electron yield, an electron yield of the second ROI is lower than an electron yield of the first ROI; (ii) when the at least one parameter is an expected electron yield, the expected electron yield of the second ROI is lower than an expected electron yield of the first ROI; (iii) and when the at least one parameter is a signal to noise ratio, the signal to noise ratio of the second ROI is lower than a signal to noise ratio of the first ROI.

2. The system according to claim 1 wherein the parameter is an electron yield, and an electron yield of the second ROI is lower than an electron yield of the first ROI.

3. The system according to claim 1 wherein the parameter is an expected electron yield, and an expected electron yield of the second ROI is lower than an electron yield of the first ROI.

4. The system according to claim 1 wherein the parameter is a signal to noise ratio, and a signal to noise ratio of the second ROI is lower than a signal to noise ratio of the first ROI.

5. The system according to claim 1 wherein the charged particles optics is configured to: perform an initial scanning of the area of the object at an initial scan rate, detect initial particles that were generated as a result of the initial scanning of the area, and generate at least one initial image of the area in response to the initial particles; and wherein the processor is configured to process the at least one initial image to detect the first and second ROI.

6. The system according to claim 5 wherein:
the processor is configured to define a first segment and a second segment that belong to the area, the first segment comprising the first ROI and the second segment comprising the second ROI;
a scanning of the first ROI at the first scan rate is included in a scanning of the first segment; and
a scanning of the second ROI at the second scan rate is included in a scanning of the second segment.

7. A system for scanning an object, the system comprises:
charged particles optics configured to:
scan, with a charged particle beam, a first region of interest (ROI) of an area of the object at a first scan rate;
detect first particles that were generated as a result of the scanning of the first ROI;
scan, with the charged particle beam, a second ROI of the area of the object at a second scan rate lower than the first scan rate, wherein the first ROI differs from the second ROI by at least one parameter; and
detect second particles that were generated as a result of the scanning of the second ROI; and
a processor that is configured to generate at least one image of the area in response to the first and second particles;
wherein the charged particles optics is configured to: perform an initial scanning of the area of the object at an initial scan rate, detect initial particles that were generated as a result of the initial scanning of the area, and generate at least one initial image of the area in response to the initial particles; and wherein the processor is configured to process the at least one initial image to detect the first and second ROI;

wherein the processor is configured to define a first segment and a second segment that belong to the area, the first segment comprising the first ROI and the second segment comprising the second ROI; a scanning of the first ROI at the first scan rate is included in a scanning of the first segment and a scanning of the second ROI at the second scan rate is included in a scanning of the second segment; and wherein the initial scan rate is higher than the second scan rate.

8. A method for imaging an object, the method comprising:
scanning, with a charged particle beam, a first region of interest (ROI) of an area of the object at a first scan rate;
detecting first particles that were generated as a result of the scanning of the first ROI;
scanning with the charged particle beam, a second ROI of the area of the object at a second scan rate lower than the first scan rate, wherein the first ROI differs from the second ROI by at least one parameter, the at least one parameter being either an electron yield, an expected electron yield or a signal to noise ratio;
detecting second particles that were generated as a result of the scanning of the second ROI; and
generating at least one image of the area in response to the first and second particles;
wherein: (i) when the at least one parameter is an electron yield, an electron yield of the second ROI is lower than an electron yield of the first ROI; (ii) when the at least one parameter is an expected electron yield, the expected electron yield of the second ROI is lower than an expected electron yield of the first ROI; (iii) and when the at least one parameter is a signal to noise ratio, the signal to noise ratio of the second ROI is lower than a signal to noise ratio of the first ROI.

9. The method according to claim 8 wherein the parameter is an electron yield and an electron yield of the second ROI is lower than an electron yield of the first ROI.

10. The method according to claim 8 wherein the parameter is an expected electron yield and an expected electron yield of the second ROI is lower than an electron yield of the first ROI.

11. The method according to claim 8 wherein the parameter is a signal to noise ratio and a signal to noise ratio of the second ROI is lower than a signal to noise ratio of the first ROI.

* * * * *